(12) United States Patent
Kang et al.

(10) Patent No.: US 8,334,602 B2
(45) Date of Patent: Dec. 18, 2012

(54) DIE PACKAGE INCLUDING ENCAPSULATED DIE AND METHOD OF MANUFACTURING THE SAME

(75) Inventors: Joon Seok Kang, Gyunggi-do (KR); Young Do Kweon, Seoul (KR); Hong Won Kim, Gyunggi-do (KR); Jingli Yuan, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 186 days.

(21) Appl. No.: 12/547,284

(22) Filed: Aug. 25, 2009

(65) Prior Publication Data

US 2010/0320624 A1    Dec. 23, 2010

(30) Foreign Application Priority Data

Jun. 18, 2009  (KR) .................. 10-2009-0054396

(51) Int. Cl.
*H01L 29/72* (2006.01)

(52) U.S. Cl. ......... 257/788; 257/738; 257/773; 257/781

(58) Field of Classification Search .................. 257/738, 257/773, 781, 788
See application file for complete search history.

(56) References Cited

U.S. PATENT DOCUMENTS 6,153,939 A * 11/2000 Wang et al. ................... 257/778
7,138,709 B2 * 11/2006 Kumamoto .................. 257/686

* cited by examiner

*Primary Examiner* — Edward Wojciechowicz
(74) *Attorney, Agent, or Firm* — Blakely Sokoloff Taylor & Zafman LLP

(57) ABSTRACT

Disclosed herein is a die package including an encapsulated die, including: a die including pads on one side thereof; an encapsulation layer covering lateral sides of the die; a support layer covering the encapsulation layer and one side of the die; a passivation layer formed on the other side of the die such that the pads are exposed therethrough; and a redistribution layer formed on the passivation layer such that one part thereof is connected with the pad. Here, since one side of the die is supported by the support layer and the encapsulation layer is formed on only the lateral side of the die, the warpage of the die package due to the difference in thermal expansion coefficient can be minimized.

3 Claims, 6 Drawing Sheets

DIE PACKAGE INCLUDING ENCAPSULATED DIE AND METHOD OF MANUFACTURING THE SAME

CROSS REFERENCE TO RELATED APPLICATION

This application claims the benefit of Korean Patent Application No. 10-2009-0054396, filed Jun. 18, 2009, entitled "Die package having encapsulated die and method of manufacturing the same", which is hereby incorporated by reference in its entirety into this application.

BACKGROUND OF THE INVENTION

1. Technical Field

The present invention relates to a die package including an encapsulated die and a method of manufacturing the same.

2. Description of the Related Art

With the advancement of the electronics industry, electronics parts have been gradually becoming highly-functionalized and miniaturized. Thus, next-generation multi-functional small-sized packages having more functions in a limited area have attracted considerable attention, and, particularly, the development of a die package provided therein with an electronic part (a die) has attracted considerable attention.

In particular, recently, a die package including a die encapsulated with a mold material has been being researched.

FIGS. 1 to 10 are sectional views showing a conventional method of manufacturing a die package including an encapsulated die, in which the die is encapsulated using a porous ceramic plate. Hereinafter, a conventional method of manufacturing a die package including an encapsulated die will be described with reference to FIGS. 1 to 10.

First, as shown in FIG. 1, a porous ceramic plate 12, which has pores through which a solvent can pass and is resistant to an encapsulation temperature (for example, 150° C. or more), is provided.

Subsequently, as shown in FIG. 2, an adhesive tape 14 for attaching dies is adhered to one side of the porous ceramic plate 12.

Subsequently, as shown in FIG. 3, dies 16 are adhered to the adhesive tape 12 in a face-down state such that pads 18 formed in one side of each of the dies 16 are brought into contact with the adhesive tape 14.

Subsequently, as shown in FIG. 4, an encapsulation layer 20 is formed on the adhesive tape 14 to cover the dies 16.

Subsequently, as shown in FIG. 5, the porous ceramic plate 12 is immersed into an organic solvent 22. In this case, the organic solvent 22 is absorbed in the porous ceramic plate by capillary action and then brought into contact with the adhesive tape 14 through the pores formed in the porous ceramic plate 12 to decrease the adhesion strength of the adhesive tape 14. For example, when the organic solvent 22 is acetone and the adhesive tape 14 is made of silicon, the acetone softens the adhesive property of the silicon tape.

Subsequently, as shown in FIG. 6, the encapsulation layer 20 including the dies 16 is separated from the adhesive tape 14 and the porous ceramic plate 12. That is, since the adhesion strength of the adhesive tape 14 is decreased by the organic solvent 22 in the afore-mentioned step, this step can be naturally performed.

Subsequently, as shown in FIG. 7, a passivation layer 24 is formed on one side of the dies 16 such that the pads 18 of the dies 16 are exposed, and then redistribution layers 26 are formed on the passivation layer 24 such that the redistribution layers 26 extend along the passivation layer 24 in a state in which one part of each of the redistribution layers 26 is connected with the pads 18.

Subsequently, as shown in FIG. 8, a solder resist layer 28 having openings for exposing the other parts of the redistribution layers 26 is formed on the passivation layer 24 and the redistribution layers 26.

Subsequently, as shown in FIG. 9, external connecting terminals 32 are respectively formed on the other parts of the redistribution layers 26.

Finally, as shown in FIG. 10, the resulting structure is cut into package units, each including an individual die, through a singulation process, resulting in a die package 10.

However, the conventional die package 10 is problematic in that the encapsulation layer 20 having a thermal expansion coefficient higher than those of other constituents is formed on both lateral sides and upper sides of the dies, so that the die package 10 warps due to the difference in thermal expansion coefficient between the encapsulation layer 20 and other constituents, thereby deteriorating the reliability of the die package 10. Moreover, the conventional die package 10 is also problematic in that, since the encapsulation layer 20 is expensive, increasing the amount of material used to form the encapsulation layer 20 increases the production cost of the die package 10.

Furthermore, the conventional die package 10 is problematic in that, since the carrier type porous ceramic plate 12 is used, its manufacturing process is complicated, and its production cost is increased.

SUMMARY OF THE INVENTION

Accordingly, the present invention has been made to solve the above-mentioned problems, and the present invention provides a die package including an encapsulated die, which can improve reliability by minimizing the occurrence of warpage due to the difference of thermal expansion coefficient, and a method of manufacturing the same Further, the present invention provides a die package including an encapsulated die, the manufacturing process of which is simple, and the production cost of which is low, and a method of manufacturing the same.

An aspect of the present invention provides a die package including an encapsulated die, including: a die including pads on one side thereof; an encapsulation layer covering lateral sides of the die; a support layer covering the encapsulation layer and the other side of the die; a passivation layer formed on the one side of the die such that the pads are exposed therethrough; and a redistribution layer formed on the passivation layer such that one part thereof is connected with the pad.

In the die package, the encapsulation layer may be formed such that its thickness is less than that of the die.

Further, the encapsulation layer may be formed such that its thickness is 10~90% of that of the die.

Further, the support layer may have a thermal expansion coefficient lower than that of the encapsulation layer.

Further, the support layer may be made of a prepreg or a liquid crystalline polymer.

Further, the die package further may include: a solder resist layer which is formed on the passivation layer and the redistribution layer and which has an opening for exposing the other part of the redistribution layer; and an external connecting terminal formed on the other part of the redistribution layer exposed by the opening.

Another aspect of the present invention provides a method of manufacturing a die package including an encapsulated die, including: adhering dies provided on one side thereof with pads to a tape in a face-down state; forming an encapsulation layer to cover lateral sides of the dies; forming a support layer to cover the encapsulation layer and the other side of the dies; removing the tape and then forming a passivation layer for exposing the pads therethrough; and forming a redistribution layer on the passivation layer such that one part thereof is connected with the pad.

In the method, in the forming of the encapsulation layer, the encapsulation layer may be formed through a printing process or a dispensing process.

Further, in the forming of the support layer, the support layer may have a thermal expansion coefficient lower than that of the encapsulation layer.

Further, in the forming of the support layer, the support layer may be made of a prepreg or a liquid crystalline polymer.

Further, in the forming of the encapsulation layer, the encapsulation layer may be formed such that its thickness is less than that of the die.

Further, the encapsulation layer may be formed such that its thickness is 10~90% of that of the die.

Further, The method may further include, after the forming of the redistribution layer: forming a solder resist layer having an opening for exposing the other part of the redistribution layer on the passivation layer and the redistribution layer; forming an external connecting terminal on the other part of the redistribution layer exposed by the opening; and cutting the resulting structure into respective package units along a scribing line by performing a singulation process.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
FIGS. 1 to 10 are sectional views showing a conventional method of manufacturing a die package including an encapsulated die, in which the die is encapsulated using a porous ceramic plate.
Figure 2:
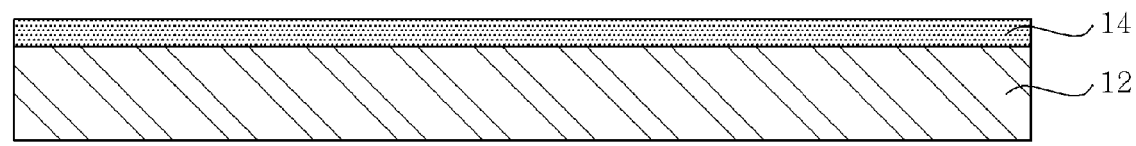
Figure 3:
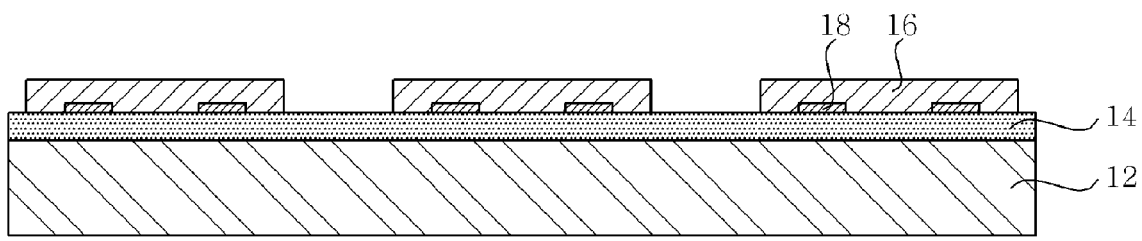
Figure 4:
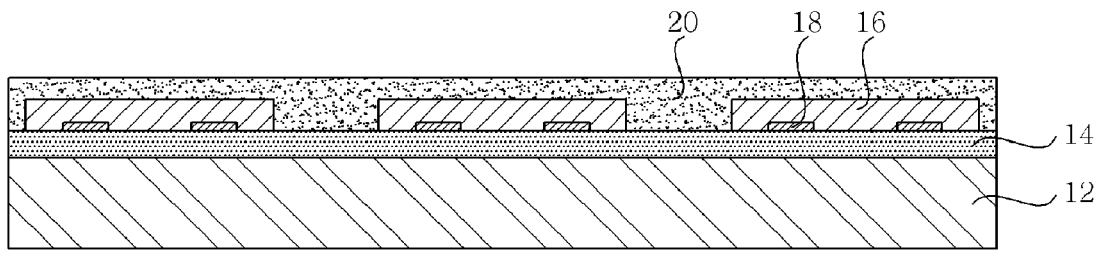
Figure 5:
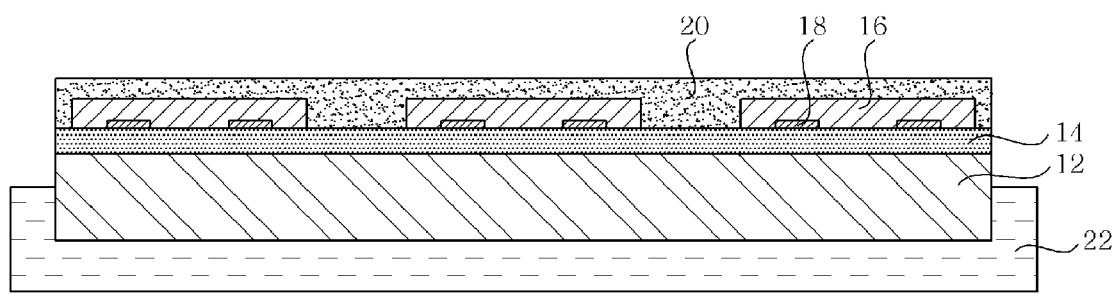
Figure 6:
Figure 7:
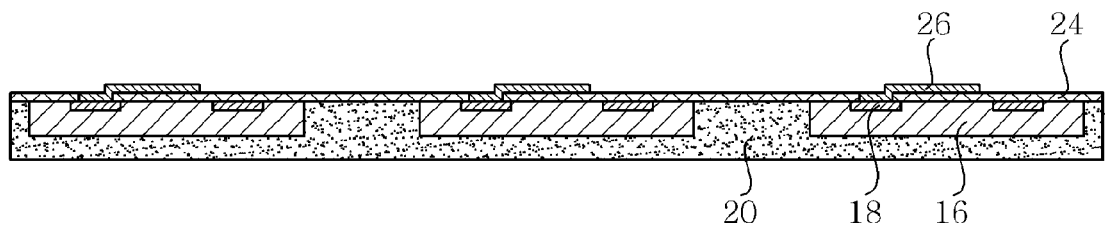
Figure 8:
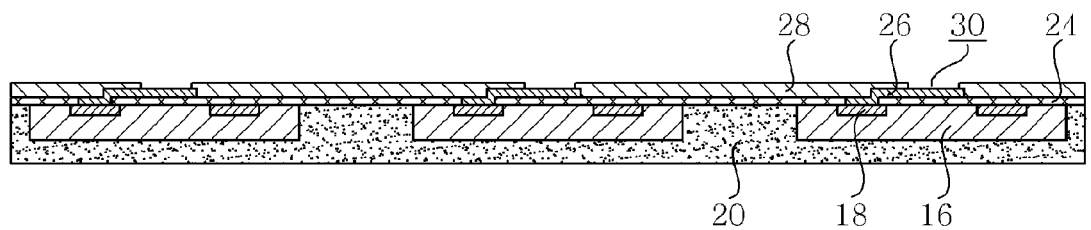
Figure 9:
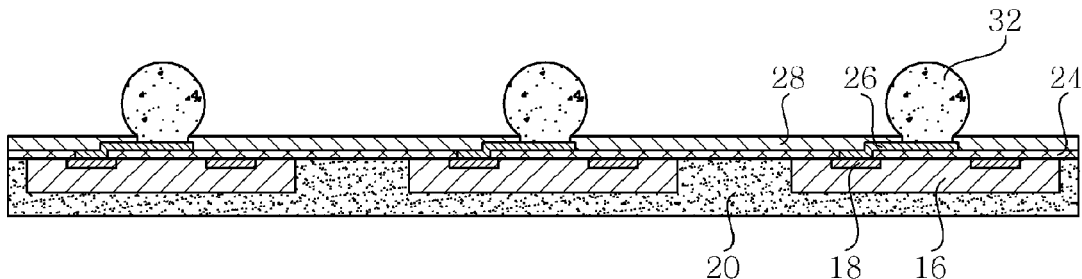
Figure 10:
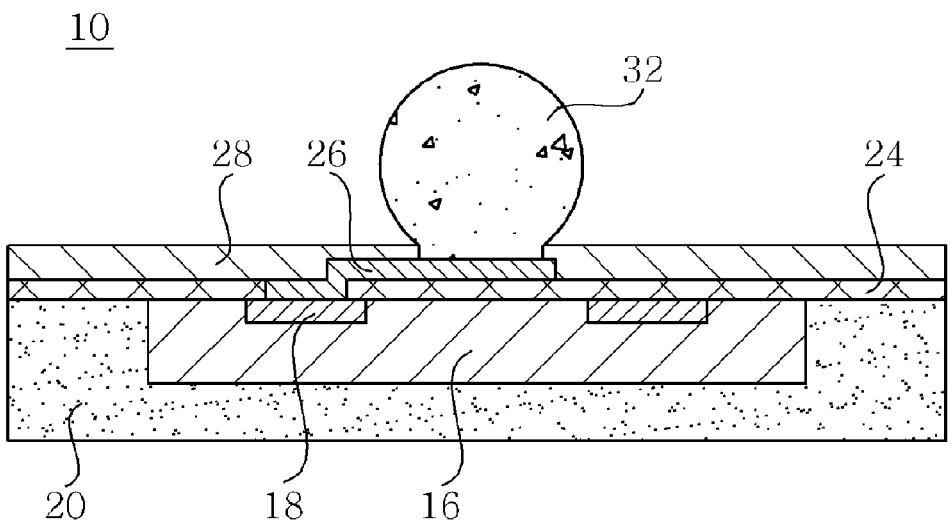

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. In the following description, the terms "first", "second" and the like are used to differentiate a certain component from other components, but the configuration of such components should not be construed to be limited by the terms. Further, in the description of the present invention, when it is assumed that the detailed description of the related art would obscure the gist of the present invention, the description thereof will be omitted.

Hereinafter, preferred embodiments of the present invention will be described in detail with reference to the attached drawings.

Structure of a Die Package Including an Encapsulated Die

Figure 11:
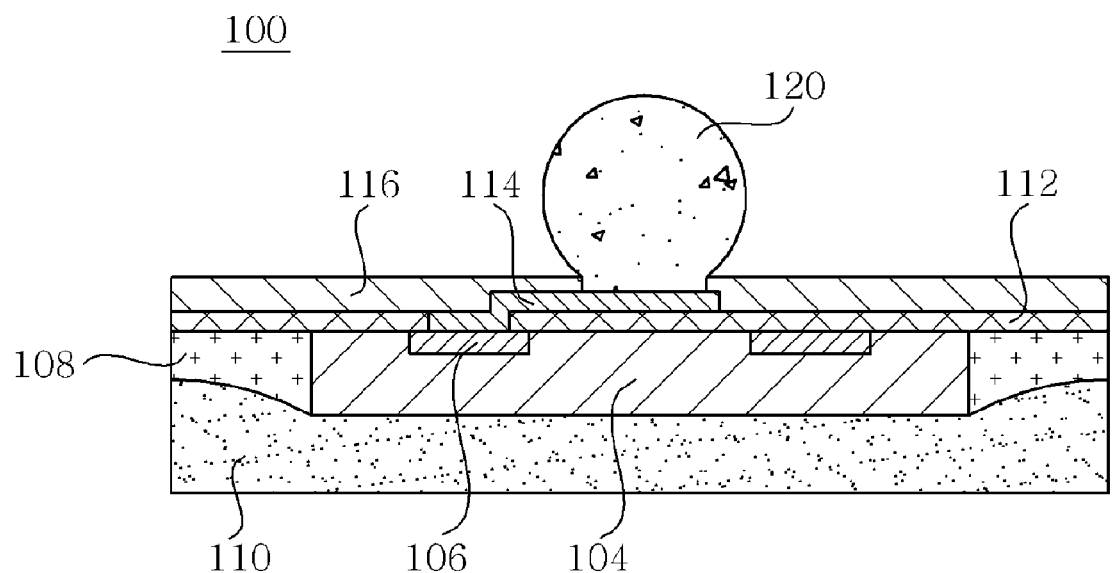
FIG. 11 is a sectional view showing a die package including an encapsulated die according to an embodiment of the present invention.

FIG. 11 is a sectional view showing a die package including an encapsulated die according to an embodiment of the present invention. Hereinafter, a die package including an encapsulated die according to an embodiment of the present invention will be described with reference to FIG. 11.

As shown in FIG. 11, a die package 100 including an encapsulated die according to an embodiment of the present invention includes a die 104, an encapsulation layer 108, a support layer 110, a passivation layer 112, and a redistribution layer 114.

The die 104 includes pads 106 electrically connected with an integrated circuit (not shown) on one side of a die body which is made of silicon and in which the integrated circuit is embedded. Here, the pads 106 are made of a metal such as aluminum.

The encapsulation layer 108 serves to impart the property of mechanical strength to the die package 100, to protect the die 104 from pollutants and to provide a surface area allowing for formation of the redistribution layer 114 and the build-up thereon. Here, in order to minimize the occurrence of warpage due to the high thermal expansion coefficient of the encapsulation layer 108, the encapsulation layer 108 is formed on the lateral side of the die 104 such that its thickness is smaller than the thickness of the die 104, preferably, such that its thickness is 10~100% of the thickness of the die 104. The encapsulation layer may be made of an epoxy molding compound (EMC).

The support layer 110, which serves to support the encapsulated die 104, is formed to cover the encapsulation layer 108 formed on the lateral side of the die 104 and the other side of the die 104. Further, the support layer 110 serves to protect the other side of the die 104, i.e. the side on which the encapsulation 108 is not formed, from pollutants. In this case, the support layer 110 is made of a material having a thermal expansion coefficient lower than that of the encapsulation layer 108, for example, a prepreg or a liquid crystalline polymer.

The passivation layer 112, which serves to protect the die 104 from the external environment, is formed of a laminate including first and second insulation films (not shown) made of silicon oxide ($SiO_2$) and a third insulation film (not shown) made of silicon nitride (SiN), and has high heat resistance and electrical insulation. The surface of the passivation layer 112 functions as the surface of the die 104.

The redistribution layer 114 serves to connect the pads 106 formed on the die 104 to larger connection pads located at other positions, and is formed such that it extends from the pads 106 to the passivation layer 112. Here, one part of the redistribution layer 114 is connected with the pad 106, and a connection pad (not shown) connected with an external connecting terminal is formed on the other part thereof. Further, the redistribution layer 114 is made of a conductive metal, such as aluminum (Al), copper (Cu), nickel (Ni), gold (Au) or the like.

Meanwhile, a solder resist layer 116 having an opening 118 for exposing the other part of the redistribution layer 114 is formed on the passivation layer 112 and the redistribution layer 114, and an external connecting terminal 120 for connecting the die 104 with an external system, such as a solder ball, may be formed on the other part of the redistribution layer 114.

Method of Manufacturing a Die Package Including an Encapsulated Die

FIGS. 12 to 19 are sectional views showing a method of manufacturing a die package including an encapsulated die according to an embodiment of the present invention. Hereinafter, a method of manufacturing a die package including an encapsulated die according to an embodiment of the present invention will be described with the reference to FIGS. 12 to 19.

Figure 12:
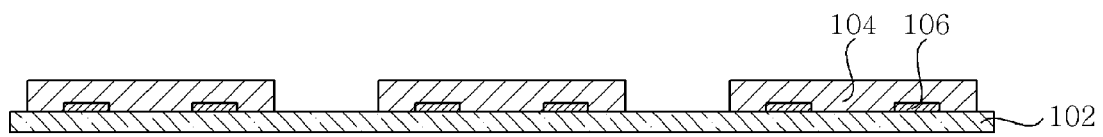
FIGS. 12 to 19 are sectional views showing a method of manufacturing a die package including an encapsulated die according to an embodiment of the present invention.

First, as shown in FIG. 12, dies 104, each of which is provided on one side thereof with pads 106, are adhered onto a tape 102 in a face-down state.

In this case, the dies 104 are adhered onto the tape 102 at regular intervals, and are adhered onto the tape 102 such that the pads 106 are brought into contact with the tape 102. Here, the tape 102 serves to support the dies 104 and to use adhesivity to prevent the dies 104 from moving during an ensuing encapsulation process. A silicon rubber adhesive tape or a polyimide (PI) adhesive tape may be used as the tape 102.

Figure 13:
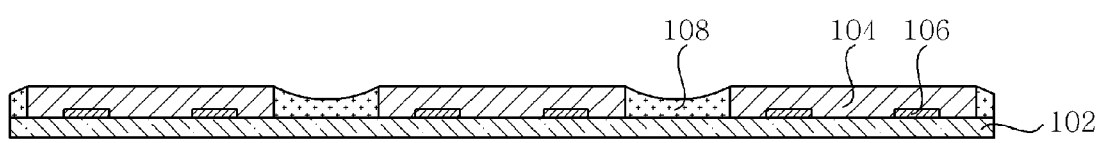

Subsequently, as shown in FIG. 13, an encapsulation layer 108 is formed on the tape 102 to cover the lateral sides of the dies 104.

In this case, the encapsulation layer 108 is made of a molding material, such as plastic, resin, epoxy molding compound or the like, and serves to impart the property of mechanical strength to the die package 100, to protect the dies 104 from pollutants and to provide a surface area allowing for formation of the redistribution layer and the build-up thereon. Since the thermal expansion coefficient (CTE) of the encapsulation layer 108 is much higher than those of other components constituting the die package 100, the die package 100 warps due to the difference in thermal expansion coefficient therebetween, so that it is preferred that the encapsulation layer 108 be used in the minimal amount necessary to achieve the original function of encapsulating the dies 104. Therefore, in this step, unlike in the conventional technology, it is preferred that the encapsulation layer 108 be formed to cover only the lateral sides of the dies 104, and that the thickness of the encapsulation layer 108 be less than that of each of the dies 104. Even in this case, since one side of the encapsulation layer 108 is flush with the one side of each of the dies 104 on which the pads 6 are formed, the encapsulation layer 108 may serve to provide a surface area for build-up.

In this step, in order to form the encapsulation layer 108 only on the lateral sides of the dies 104, a printing process or a dispensing process may be employed.

That is, in this step, a printing process used to apply an encapsulation material using a mask having openings for exposing the lateral sides of the dies 104 and a dispensing process used to apply an encapsulation material using a dispenser are used, thus forming the encapsulation layer 108 covering the lateral sides of the dies 104 without an additional process, such that the encapsulation layer 108 is thinner than each of the dies 104. For example, when the encapsulation layer 108 is formed using conventional transfer molding or compression molding, since the encapsulation layer 108 is formed even on other sides of the dies 104 in addition to the lateral side thereof, there is a problem in that an additional process, such as a polishing process, is required. However, as in this step, when a printing process or a dispensing process is used, the encapsulation layer 108 can be formed only on the lateral sides of the dies 104.

Figure 14:
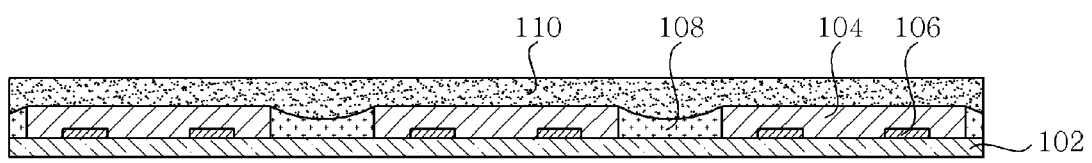

Subsequently, as shown in FIG. 14, a support layer 110 is formed on the encapsulation layer 108 and the dies 104 to cover the encapsulation layer 108 and the other sides of the dies 104.

Here, the support layer 110 serves to support the encapsulated dies 104, and is formed to cover the other sides of the dies 104 and the encapsulation layer formed on the lateral side of the dies 104. The support layer 110 further serves to protect the other sides of the dies 104, i.e. those sides on which the encapsulation layer 108 are not formed, from pollutants.

In this case, the support layer 110 is made of a material having a thermal expansion coefficient lower than that of the encapsulation layer 108, for example, prepreg or liquid crystalline polymer. That is, owing to the low thermal expansion coefficient of the support layer 110, the high thermal expansion coefficient of the encapsulation layer 108 is attenuated, thus minimizing the occurrence of the warpage of the die package.

Figure 15:
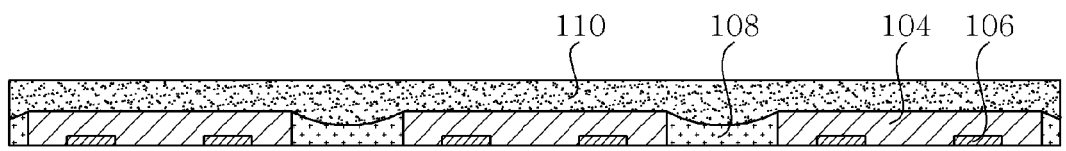

Subsequently, as shown in FIG. 15, the tape 102 is removed.

Figure 16:
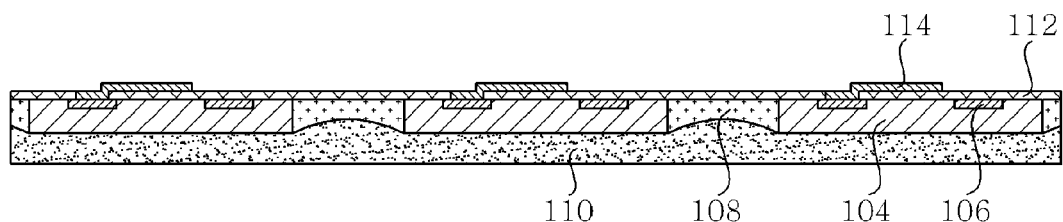

Subsequently, as shown in FIG. 16, the encapsulated dies 104 are turned over, and then a passivation layer 112 is formed on one side of the encapsulated dies 104 such that the pads 106 are exposed, and then redistribution layers 114 are formed on the passivation layer 112 in a state in which one part of each of the redistribution layers 114 is connected to the pad 106. Here, when a passivation layer is collectively formed on dies in a FAB process, a process of forming a passivation layer may be omitted.

In this case, the redistribution layers 114 serve to direct the pads 106 formed in the dies 104 to other positions, and may be provided with additional connection pads. One part of each of the redistribution layers 114 is connected with the pad 106, and each of the redistribution layers 114 is made of a conductive metal, such as aluminum (Al), copper (Cu), nickel (Ni), gold (Au) or the like. Further, an auxiliary adhesion layer (UBM) may be selectively formed on the other part of each of the redistribution layers 114 in order to improve the adhesive force between the redistribution layer 114 and an external connecting terminal.

Figure 17:
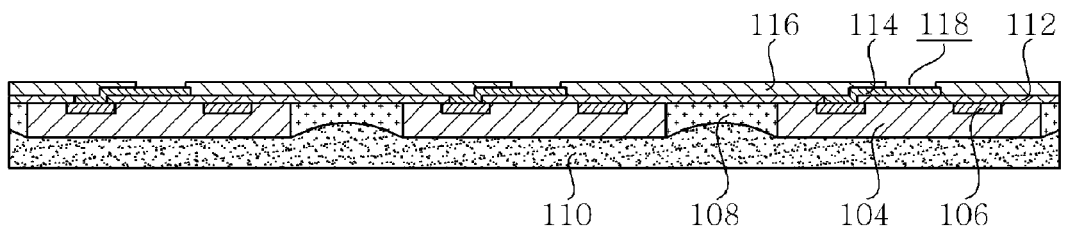

Subsequently, as shown in FIG. 17, a solder resist layer 116 having openings 118 for exposing the other parts of the redistribution layers 114 is formed on the passivation layer 112 and the redistribution layers 114.

Here, the other parts of the redistribution layers 114 serve as connection pads. The solder resist layer 116 is formed in order to protect the redistribution layers excluding the other parts thereof and the passivation layer 112.

Figure 18:
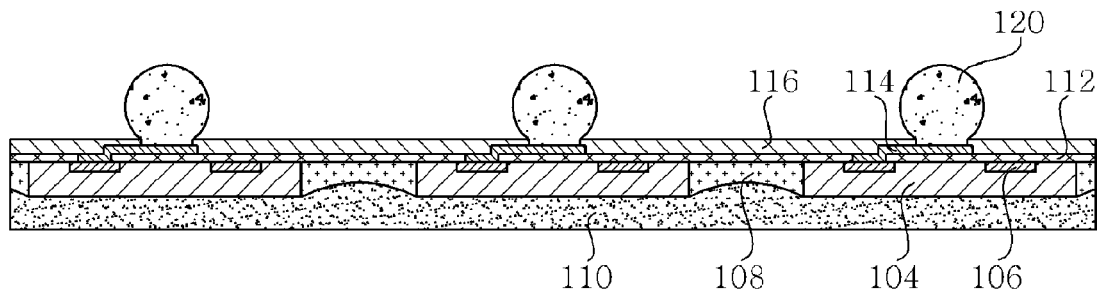

Subsequently, as shown in FIG. 18, external connecting terminals 120, such as solder balls, are formed on the other parts of the redistribution layers 114, which are exposed through the openings 118 formed in the solder resist layer 116.

Figure 19:
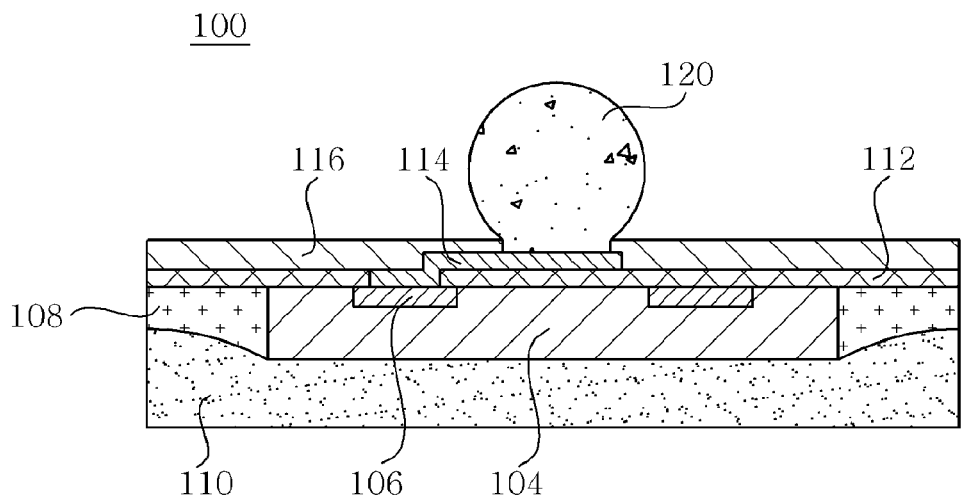

Finally, as shown in FIG. 19, the resulting structure is cut into respective package units along a scribing line by performing a singulation process using a dicing apparatus, thus manufacturing a die package 100 shown in FIG. 11.

As described above, according to the present invention, an encapsulation layer having a thermal expansion coefficient higher than that of other constituents is formed on only the lateral side of a die, and the other side of the die is covered with a cheap support layer, so that the occurrence of the warpage of a die package due to the difference in thermal expansion coefficient between the encapsulation layer and other constituents is minimized, thereby improving the reliability of the die package and decreasing the production cost thereof.

Further, according to the present invention, an encapsulation layer is formed through a printing process or a dispensing process, so that the pressure applied to a die is minimized, with the result that the encapsulation layer can be formed without an additional process.

Further, according to the present invention, a support layer for supporting one side of a die is used after a manufacturing process as well as during the manufacturing process, so that an additional carrier member is not required, thereby simplifying the manufacturing process and decreasing the production cost of a die package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A die package including an encapsulated die, comprising:
    a die including pads on one side thereof;
    an encapsulation layer covering lateral sides of the die;
    a support layer covering the encapsulation layer and the other side of the die;
    a passivation layer formed on the one side of the die such that the pads are exposed therethrough; and
    a redistribution layer formed on the passivation layer such that one part thereof is connected with the pad;
    wherein the encapsulation layer is formed such that its thickness is 10~100% of the die, the support layer is made of a prepreg or a liquid crystalline polymer, the encapsulation layer is made of an epoxy molding compound.

2. The die package according to claim 1, wherein the support layer has a thermal expansion coefficient lower than that of the encapsulation layer.

3. The die package to claim 1, further comprising:
    a solder resist layer which is formed on the passivation layer and the redistribution layer and which has an opening for exposing the other part of the redistribution layer; and
    an external connecting terminal formed on the other part of the redistribution layer exposed by the opening.

* * * * *